United States Patent [19]

Yamada et al.

[11] Patent Number: 5,254,178

[45] Date of Patent: Oct. 19, 1993

[54] THERMOELECTRIC TRANSDUCER APPARATUS COMPRISING N- AND P-TYPE SEMICONDUCTORS AND HAVING ELECTRONIC CONTROL CAPABILITIES

[75] Inventors: Kenji Yamada, Chiryu; Yoshitaka Tomatsu, Nagoya; Tatsuya Oike, Okazaki; Kazutoshi Nishizawa, Toyoake, all of Japan

[73] Assignee: Nippondenso Co., Ltd., Kariya, Japan

[21] Appl. No.: 784,230

[22] Filed: Oct. 30, 1991

[30] Foreign Application Priority Data

| | | | |
|---|---|---|---|
| Oct. 30, 1990 | [JP] | Japan | 2-290837 |
| Apr. 16, 1991 | [JP] | Japan | 3-84277 |
| Jul. 4, 1991 | [JP] | Japan | 3-164411 |
| Sep. 20, 1991 | [JP] | Japan | 3-241465 |

[51] Int. Cl.$^5$ .................................. H01L 35/28
[52] U.S. Cl. ................... 136/204; 136/230; 136/211; 136/224; 62/3.3
[58] Field of Search ............... 136/203, 204, 211, 212, 136/224, 225; 62/3.3

[56] References Cited

U.S. PATENT DOCUMENTS

| | | | |
|---|---|---|---|
| 2,944,404 | 7/1960 | Fritts | 62/3 |
| 2,992,538 | 7/1961 | Poganski | 62/3 |
| 2,992,539 | 7/1961 | Curtis et al. | 62/3 |
| 3,071,495 | 1/1963 | Hanlein | 136/224 X |
| 3,181,304 | 5/1965 | Boke | 62/3 |
| 3,254,494 | 6/1966 | Chartouni | 62/3 |
| 3,524,771 | 8/1970 | Green | 136/203 |
| 3,635,037 | 1/1972 | Hubert | 62/3 |
| 3,726,100 | 4/1973 | Widakowich | 136/204 X |
| 3,943,553 | 3/1976 | Elfving et al. | 136/225 X |
| 4,444,991 | 4/1984 | Beale | 136/225 |
| 4,465,894 | 8/1984 | Reyes | 136/225 |
| 5,031,689 | 7/1991 | Jones et al. | 136/204 X |
| 5,042,257 | 8/1991 | Kendrick et al. | 136/203 X |
| 5,168,339 | 12/1992 | Yokotani et al. | 62/3.3 X |

FOREIGN PATENT DOCUMENTS

| | | |
|---|---|---|
| 53-99796 | 8/1978 | Japan . |
| 63-99169 | 6/1988 | Japan . |

*Primary Examiner*—Peter A. Nelson
*Attorney, Agent, or Firm*—Cushman, Darby & Cushman

[57] ABSTRACT

A thermoelectric transducer apparatus comprises a group of thermoelectric elements having N-type elements and P-type elements alternately arranged in a single line and a number of alternately arranged heat-absorbing-type and heat-liberating-type plate electrodes to electrically and serially connect said N- and P-type elements. Each of said heat-absorbing-type plate electrodes is extended to form a pair of integral heat-absorbing heat exchanger plates projecting in a direction from said group of elements, said pair of heat-absorbing heat exchanger plates having a pair of first plane areas extending in parallel with the group of elements and oppositely from each other and a pair of second plane areas extending from the respective first plane areas to leave the groups of elements, the outer surface of each of said second plane areas of each heat-absorbing heat exchanger plate being respectively bonded to the adjacent second plane areas of the neighboring heat-absorbing heat exchanger plates by means of insulating adhesive agent. Each of said heat-liberating-type plate electrodes has a pair of first plane areas and a pair of second plane areas all similar to those of each heat-absorbing p-type plate electrode. First and second partition walls for separating the cooled and coolant fluids of the thermoelectric transducer apparatus are formed by serially connecting the first plane areas of said heat-absorbing heat exchanger plates and those of said heat-liberating heat exchanger plates.

22 Claims, 11 Drawing Sheets

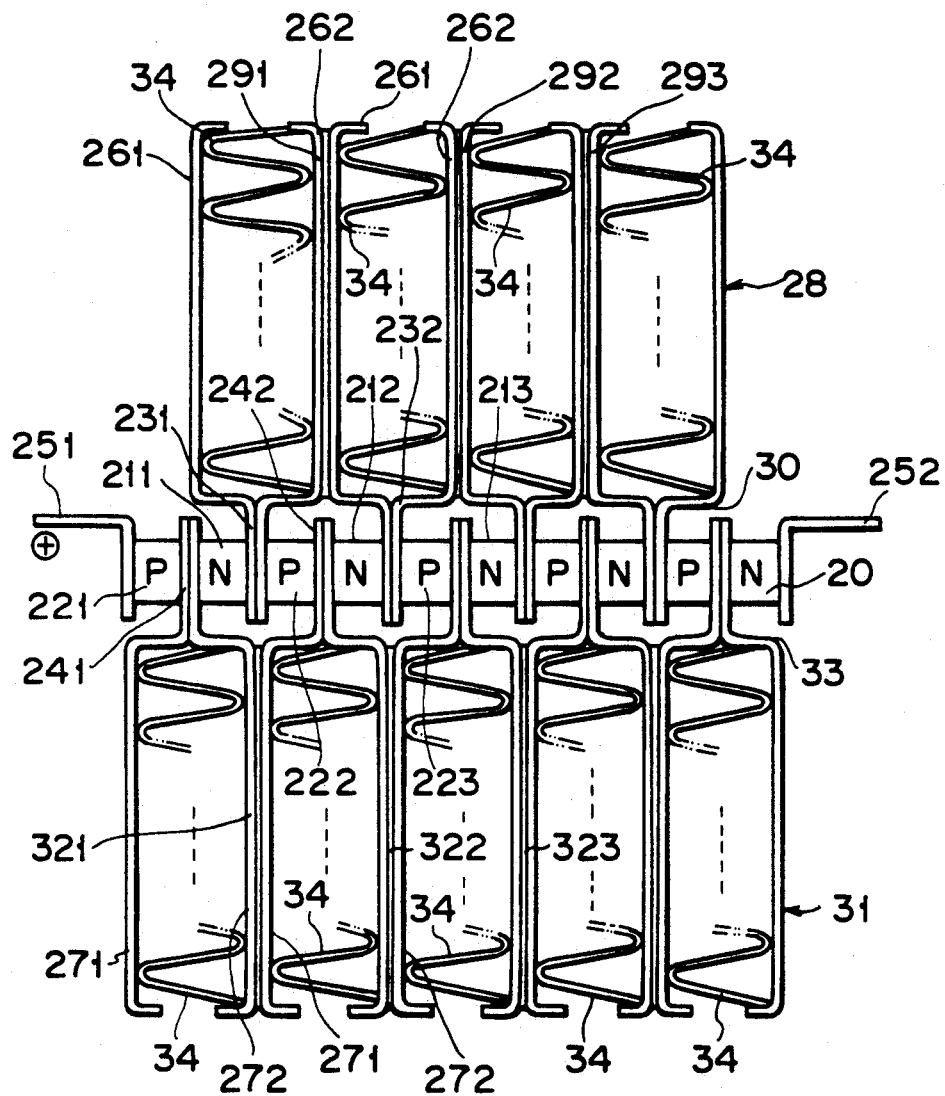
F I G. 1

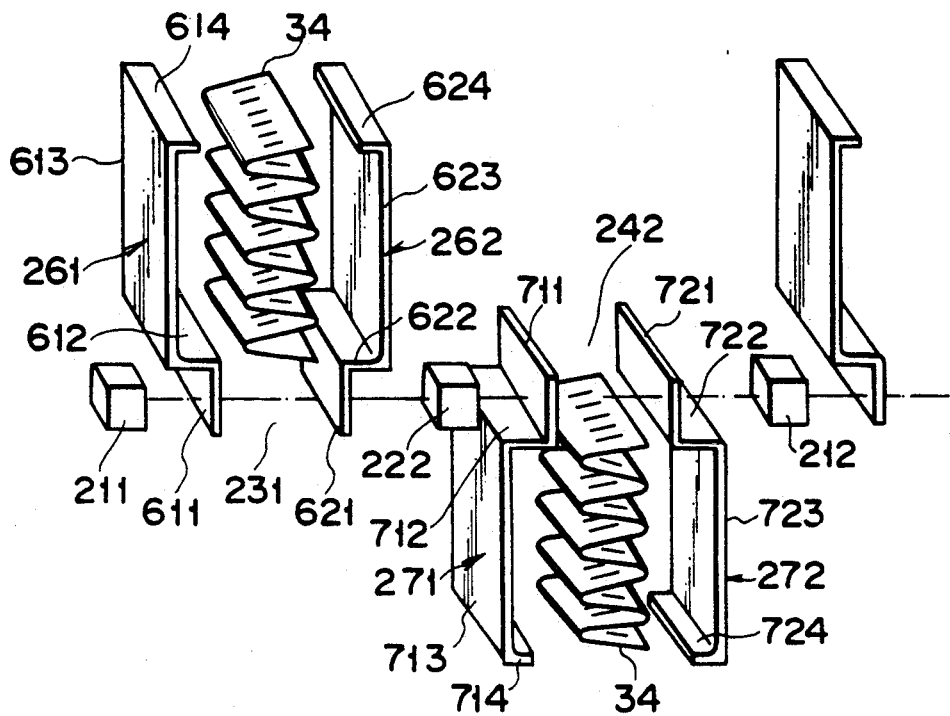
FIG. 2
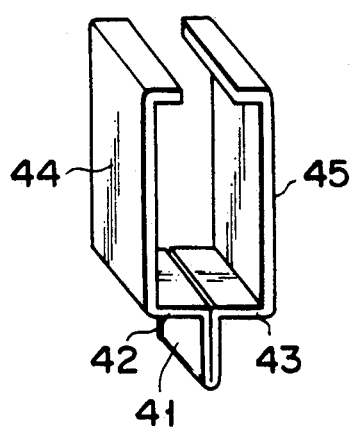
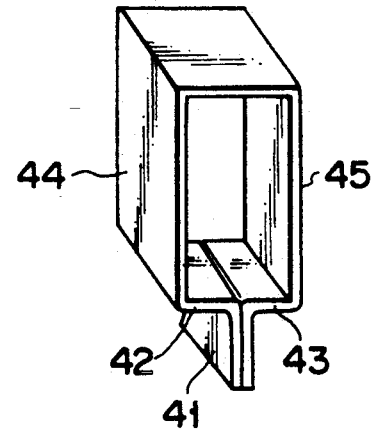
FIG. 3A  FIG. 3B

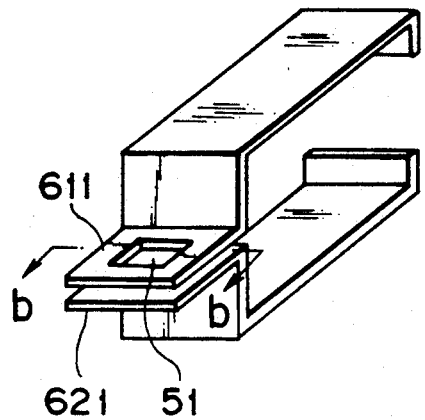
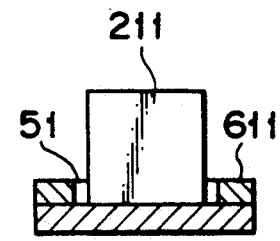
F I G. 4B
F I G. 4A
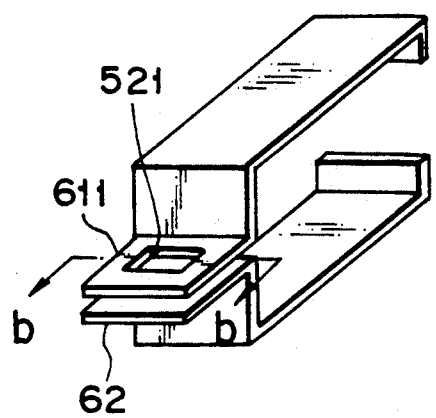
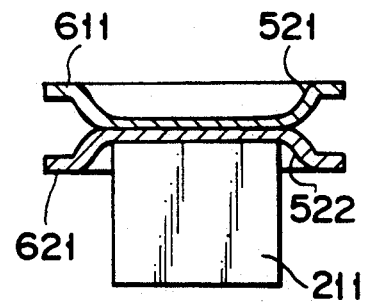
F I G. 5B
F I G. 5A

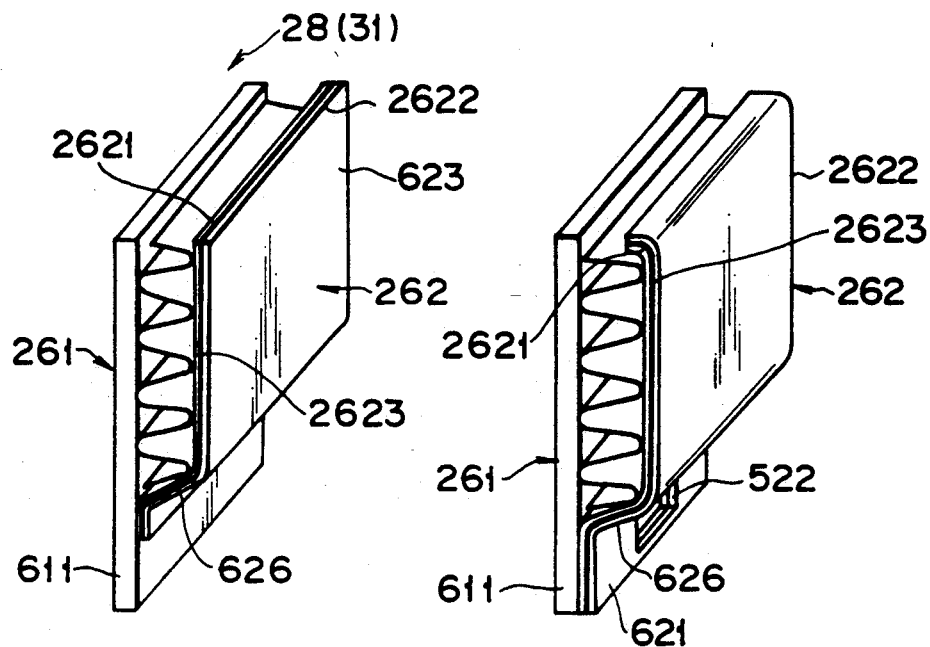
F I G. 8A   F I G. 8B
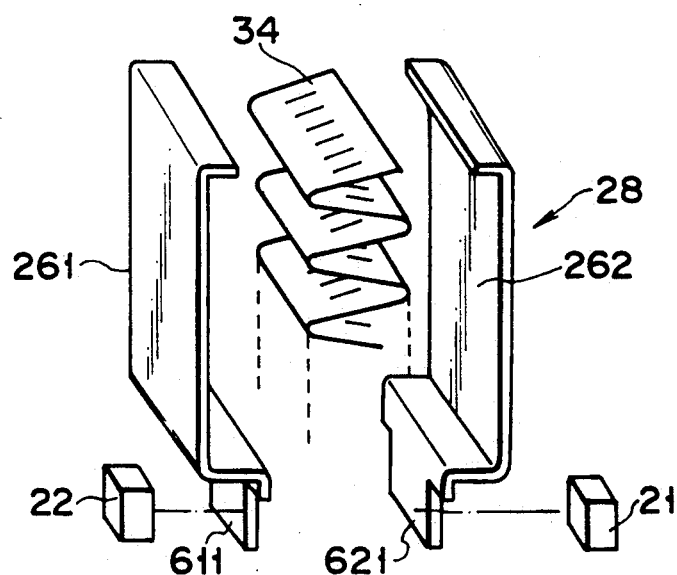
F I G. 9

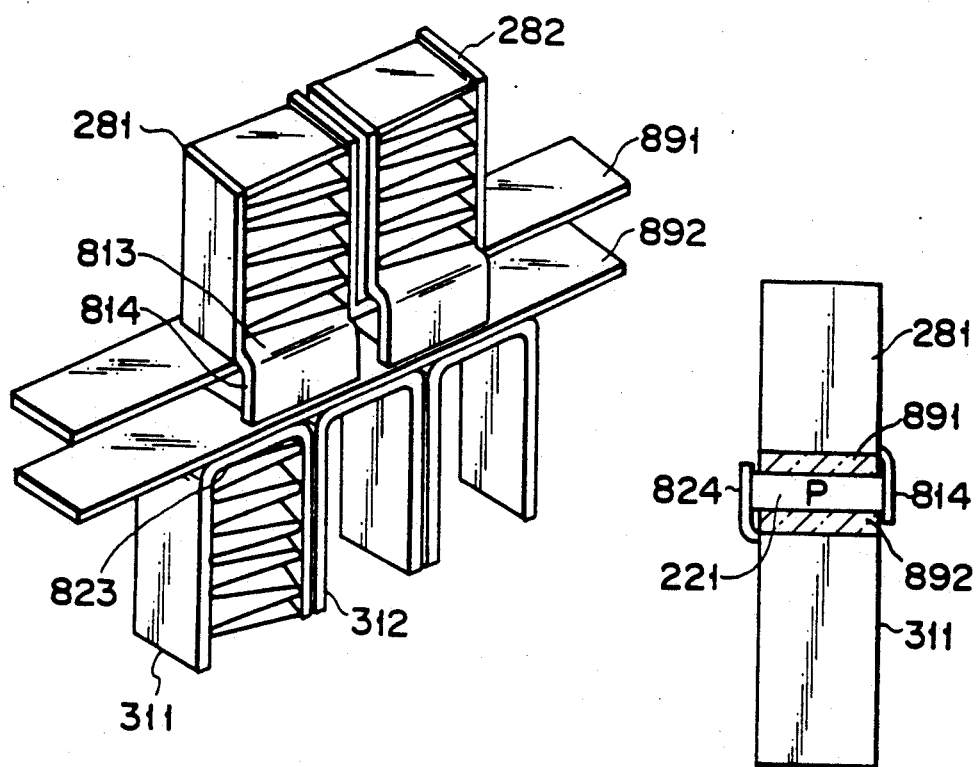
FIG. 17A
FIG. 17B
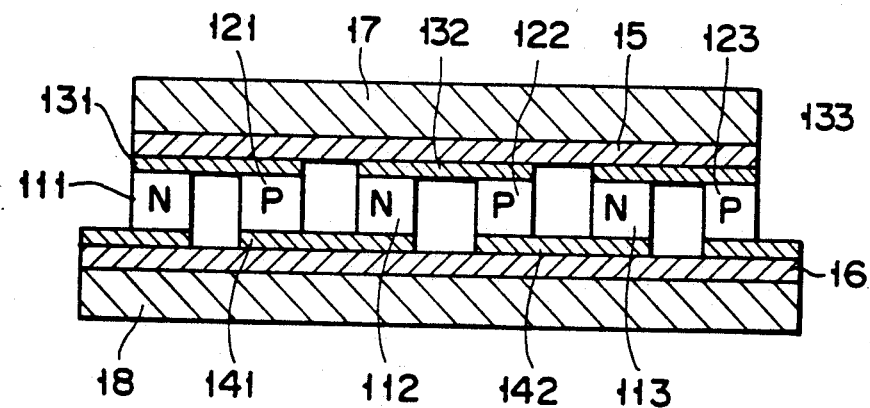
PRIOR ART
FIG. 18

THERMOELECTRIC TRANSDUCER APPARATUS COMPRISING N- AND P-TYPE SEMICONDUCTORS AND HAVING ELECTRONIC CONTROL CAPABILITIES

BACKGROUND OF THE INVENTION

1. Field of the Invention

This invention relates to a thermoelectric transducer apparatus comprising N-type thermoelectric transducer elements constituted by N-type semiconductors and P-type thermoelectric transducer elements constituted by P-type semiconductors and having electronic control capabilities to be suitably used for electronic freezers and other applications.

2. Description of the Related Art

There have been proposed various cooling apparatuses that can be electronically controlled by means of N- and P-type thermoelectric transducer elements respectively constituted by N- and P-type semiconductors. FIG. 18 shows one of such thermoelectric transducer apparatus comprising a plurality of N-type thermoelectric transducer elements 111, 112, ... constituted by N-type semiconductors and also a plurality of P-type thermoelectric transducer elements 121, 122, ... constituted by P-type semiconductors.

Here, the N-type thermoelectric transducer elements 111, 112, ... and the P-type thermoelectric transducer elements 121, 122, ... are alternately arranged and separated from adjacent transducer elements, paired adjacent transducer elements being connected alternately by heat absorber plate electrodes 131, 132, ... and heat liberator plate electrodes 141, 142, ... physically in a zig-zag manner but electrically in series. When DC voltage is applied to such a series circuit comprising a plurality of N-type thermoelectric transducer elements 111, 112, ... and P-type thermoelectric transducer elements 121, 122, ..., the heat absorber plate electrodes 131, 132, ..., each of which is connected with an upstream N-type thermoelectric transducer element and a downstream P-type thermoelectric transducer element, are cooled due to the Peltier effect, while the heat liberator plate electrodes 141, 142, ..., each of which is connected conversely with an upstream P-type thermoelectric element and a downstream N-type thermoelectric element, are heated and become hot.

A pair of insulator plates 15 and 16 are arranged respectively in contact with the outer surface of the heat absorber plate electrodes 131, 132, ... and that of the heat liberator plate electrodes 141, 142, ..., said plate electrodes constituting effective functional areas of the thermoelectric transducer apparatus, and then a heat-absorbing-type heat exchanger 17 and a heat-liberating-type heat exchanger 18 are bonded to the respective outer surfaces of the insulator plates 15 and 16.

In a thermoelectric transducer apparatus having a configuration as described above, any neighboring ones of the plate electrodes 131, 132, ... and 141, 142, ... are electrically securely insulated from one another by the insulator plates 15 and 16 and the conductive heat exchangers 17 and 18 are arranged outside the respective insulator plates 15 and 16. Therefore, the low temperature state of the heat-absorbing-type plate electrodes 131, 132, ... and the high temperature state of the heat-liberating-type plate electrodes 141, 142, ... are not effectively transferred to the respective heat exchangers 17 and 18 because of the heat barriers of the insulator plates 15 to consequently reduce the heat absorption efficiency and the heat liberation efficiency of the respective sides.

The electric current supplied to the functional areas of the thermoelectric transducer apparatus runs through the heat-absorbing-type and heat-liberating-type plate electrodes 131, 132, ..., 141, 142, ... to generate Joule heat by the electric resistance of the plate electrodes and further reduce the cooling effect of the apparatus.

SUMMARY OF THE INVENTION

Therefore, it is an object of the present invention to provide a thermoelectric transducer apparatus having a simple construction and a sufficient mechanical strength in which the low and high temperature states of the heat-absorbing-type and heat-liberating-type plate electrodes are effectively transferred to enhance the heat exchange efficiency of the apparatus and the coolant fluid of its heat-liberating-type heat exchanger are efficiently separated from the cooled fluid of its heat-absorbing-type heat exchanger.

Another object of the present invention is to provide a thermoelectric transducer apparatus in which heat-absorbing-type and heat-liberating-type electrodes are directly connected with respective plates of its heat-absorbing-type heat exchanger and those of its heat-liberating-type heat exchanger to enhance the heat exchange efficiency of the apparatus.

Still another object of the present invention is to provide a thermoelectric transducer apparatus having a simple construction and a sufficient mechanical strength in which the flow paths of the coolant fluid and the cooled fluid of its heat exchangers are constituted by the plates of the respective heat exchangers to simplify the overall construction of the apparatus and at the same time enhance its mechanical strength.

According to the invention, the above objects of the invention are achieved by providing a thermoelectric transducer apparatus comprising a group of pairs of thermoelectric elements arranged in a single line, each pair being constituted by an N-type element and a P-type element arranged in this order, and alternately arranged heat-absorbing-type plate electrodes and heat-liberating-type plate electrodes, each plate electrode being interposed between two adjacent ones of said group of thermoelectric elements and electrically connected thereto, each of said heat-absorbing-type plate electrodes having an extension on one side of said group of thermoelectric elements to form a heat-absorbing plate, the heat-absorbing plates of the extensions of the heat-absorbing-type plate electrodes forming a heat-absorbing-type heat exchanger section, each of said heat-liberating-type plate electrodes having an extension on the other side of said group of thermoelectric elements to form a heat-liberating plate, the heat-liberating plates of the extensions of the heat-liberating-type plate electrodes forming a heat-liberating-type heat exchanger section. Each of the plates of the heat exchanger sections comprises a first plane area formed by bending it outwardly along the line of the group of thermoelectric elements and a second plane area formed by bending it rectangularly from said first plane area, any two adjacent second plane areas of the plates being physically bonded together and electrically insulated from each other to form partitions for separating said heat-absorbing-type heat exchanger section and said heat-liberating-type heat exchanger section. Said partitions are realized by bonding the first plane areas of the heat-absorbing plates and those of the heat-liberating plates in a end-to-end manner.

Since electricity flows along the line of thermoelectric elements in a thermoelectric transducer apparatus having a configuration as described above, the power loss due to the resistance of the heat-absorbing-type and heat-liberating-type plate electrodes and the Joule heat generated by the resistance of the plate electrodes can be minimized. Moreover, such an arrangement offers a maximum heat exchange efficiency since each of the plate electrodes are directly connected to a pair of heat-absorbing plates or a pair of heat-liberating plates. Besides, since the heat-absorbing-type heat exchanger section and the heat-liberating-type heat exchanger section respectively constituted by these heat-absorbing plates and heat-liberating plates are separated by the partition walls formed by the first plane areas of the plates, the fluid of the heat-absorbing side is completely kept away from the fluid of the heat liberating side. Finally, since any two adjacent second plane areas are bonded together but electrically insulated from each other, the apparatus shows an enhanced overall mechanical strength.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a front view of a first embodiment of the thermoelectric transducer apparatus of the invention, schematically illustrating its configuration;

FIG. 2 is an exploded perspective partial view of the heat exchangers of the embodiment of FIG. 1;

FIGS. 3A and 3B are perspective views of two modified plate pairs to be used for one of the heat exchangers of the embodiment of FIG. 1;

FIG. 4A is a perspective view of still another modified plate pair to be used for one of the heat exchangers of the embodiment of FIG. 1;

FIG. 4B is an enlarged sectional view of the plate pair of FIG. 4A cut along b—b line of FIG. 4A;

FIG. 5A is a perspective view of still another modified plate pair to be used for one of the heat exchangers of the embodiment of FIG. 1;

FIG. 5B is an enlarged sectional view of the plate pair of FIG. 5A cut along b—b line of FIG. 5A;

FIGS. 8A and 8B are perspective views of two alternative forms of a plate pair to be used for one of the heat exchangers of the embodiment of FIG. 7;

FIG. 9 is an exploded perspective view of another modified plate pair to be used for one of the heat exchanger of the embodiment of FIG. 7;

FIG. 17A is a perspective view of a tenth embodiment of the thermoelectric transducer apparatus of the invention, schematically illustrating its configuration;

FIG. 17B is a sectional side view of the embodiment of FIG. 17A; and

FIG. 18 is a sectional view of a conventional thermoelectric transducer apparatus.

DETAILED DESCRIPTION OF THE PREFERRED EMBODIMENTS

Figure 6:
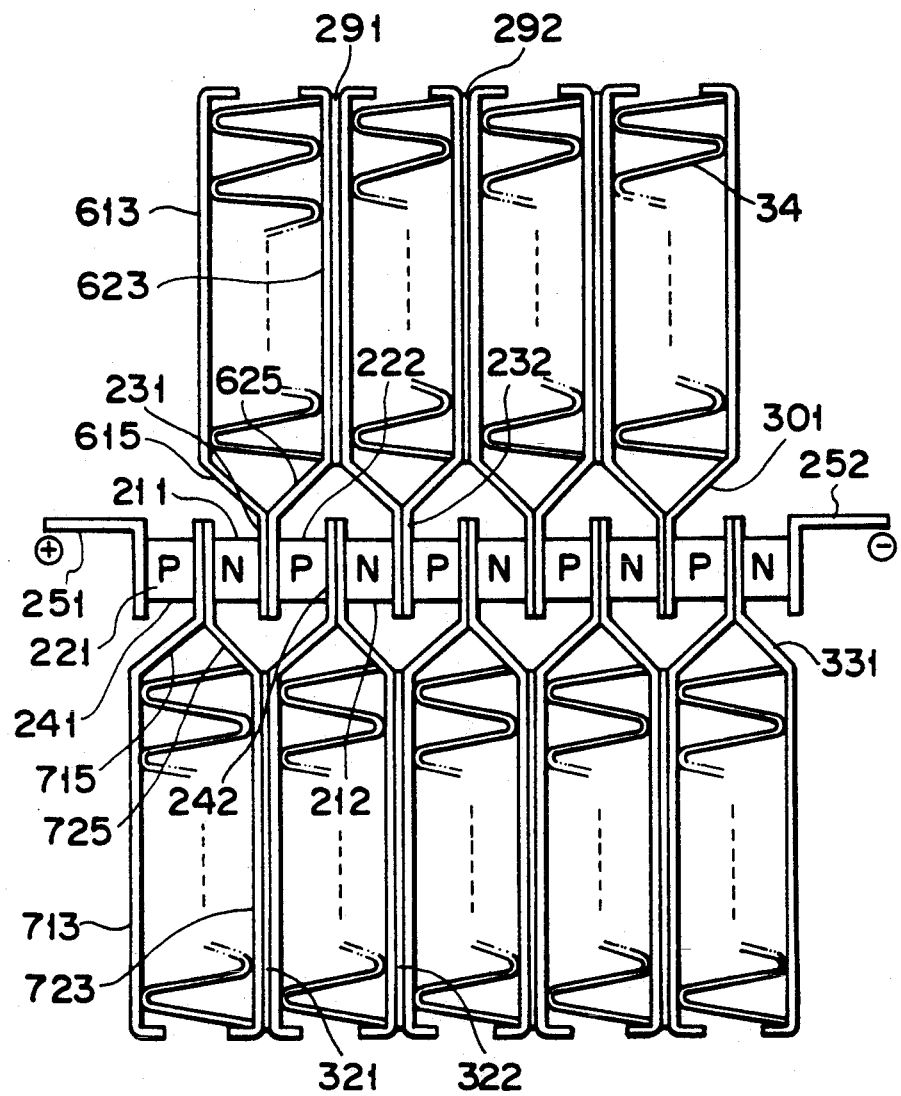
FIG. 6 is a front view of a second embodiment of the thermoelectric transducer apparatus of the invention, schematically illustrating its configuration.

Referring to FIG. 1 showing a first embodiment of the thermoelectric transducer apparatus of the invention provided with a thermoelectric transducer unit 20, said thermoelectric transducer unit 20 is a group of thermoelectric comprising a plurality of N-type thermoelectric elements 211, 212, . . . and P-type thermoelectric elements 221, 222, . . . , said N-type thermoelectric elements 211, 212, . . . and P-type thermoelectric elements 221, 222, being alternately arranged in a single horizontal line.

Heat-absorbing-type plate electrodes 231, 232, . . . and heat-liberating-type plate electrodes 241, 242, . . . are alternately arranged along the line of thermoelectric elements in such a manner that each of the plate electrodes are inserted between two adjacent thermoelectric elements and securely bonded thereto by means of a conductive brazing material such solder or a conductive adhesive agent. Terminals 251 and 252 are respectively arranged at the two lateral ends of the thermoelectric transducer unit 20 and connected to the positive and negative terminals of a power source (not shown) so that a direct current of electricity may always take place in the direction from the P-type thermoelectric element 221 toward the N-type thermoelectric element 211. Thus, the heat-absorbing-type plate electrodes 231, 232, . . . arranged at the NP junctions through which electricity flows from the N-type thermoelectric elements 211, 212, . . . to the respective P-type thermoelectric elements 221, 222, . . . are cooled due to the Peltier effect, whereas the heat-liberating-type plate electrodes 241, 242, ... arranged at the PN junctions are heated.

Each of the heat-absorbing-type plate electrodes 231, 232, ... is formed by bonding together a pair of thermally conductive metal plates 261 and 262 without losing the electric conductivity of the metal plates at the interface. Similarly, each of the heat-liberating-type plate electrodes 241, 242, ... are formed by bonding a pair of thermally conductive metal plates 271 and 272.

FIG. 2 is an exploded perspective partial view of the thermoelectric transducer unit 20 of FIG. 1, showing only the heat-absorbing-type plate electrode 231 comprising a pair of metal plates 261 and 262, the heat-liberating-type plate electrode 242 comprising a pair of metal plates 271 and 272 and the related thermoelectric elements. The plates 261 and 262 of the heat-absorbing-type plate electrode 231 respectively comprise electrode sections 611 and 621 which are jointly sandwiched by a pair of thermoelectric elements and sections extending upward from the respective electrode sections 611 and 621, although said extended sections are bent rectangularly and outwardly at the end of the respective electrode sections 611 and 621 and slightly off the line of thermoelectric elements to produce first plane areas 612 and 622. The extended sections are then bent rectangularly and upwardly to produce respective second plane areas 613 and 623, which second plane areas 613 and 623 are vertical and designed to serve as heat-absorbing fins.

The extended sections are thereafter bent again rectangularly but inwardly this time at the remote ends of the second plane areas 613 and 623 to produce respective anchor areas 614 and 624, the front ends of said anchor areas 614 and 624 being arranged face to face.

The electrode sections 611 and 621 are bonded together without losing electric conductivity of the metal plates at the interface. The heat-absorbing-type plate electrode 231 prepared in this way is then soldered to the N-type thermoelectric element 211 and the P-type thermoelectric element 222 at the outer surfaces of the electrode sections 611 and 621.

Similarly to the plates 261 and 262, the plates 271 and 272 of the heat-absorbing-type plate electrode 242, which is inserted between the P-type thermoelectric element 222 and the N-type thermoelectric element 212, respectively comprise electrode sections 711 and 721 which are jointly sandwiched by a pair of thermoelectric elements and sections extending downward from the respective electrode sections 711 and 721 or in a direction opposite to that of their counterparts 611 and 612, although said extended sections are bent rectangularly and outwardly at the end of the respective electrode sections 711 and 721 and slightly off the line of thermoelectric elements to produce first plane areas 712 and 722. The extended sections are then bent rectangularly and upwardly to produce respective second plane areas 713 and 723, which second plane areas 713 and 723 are vertical and designed to serve as heat-absorbing fins. The extended sections are thereafter bent again rectangularly but inwardly this time at the remote ends of the second plane areas 713 and 723 to produce respective anchor areas 714 and 724, the front ends of said anchor areas 714 and 724 therefore being arranged face to face. The electrode sections 711 and 721 are bonded together without losing electric conductivity of the metal plates at the interface. The heat-absorbing-type plate electrode 242 prepared in this way is then bonded by soldering to the P-type thermoelectric element 222 and the N-type thermoelectric element 212 at the outer surfaces of the electrode sections 711 and 721.

Thus, each of the heat-absorbing-type plate electrodes 231, 232, ... comprises a pair of plates 261 and 262, their outwardly extended second plane areas 613 and 623 serving as so many heat-absorbing-type heat exchange fins of a heat-absorbing-type heat exchanger 28.

While the outer surfaces of the second plane areas 613 and 623 of the plates 261 and 262 of each of the plate electrodes 231, 232, ... are arranged physically in contact with the corresponding outer surfaces of the second plane areas 613 and 623 of the plates 261 and 262 of the adjacent plate electrodes, any of the paired outer surfaces which are in close contact with each other are bonded together by means of electrically insulating adhesive agent to establish a electrically insulated condition between them. Consequently layers of the adhesive agent 291, 292, ... are formed.

The first plane areas 612 and 622 of the plates 261, 262 of the plate electrodes 231, 232, ... are serially connected in an end-to-end manner to form a partition wall 30 extending in parallel with the line of the N-type thermoelectric elements 211, 212, ... and the P-type thermoelectric elements 221, 222, ... and provide a flow path for the cooled fluid of the thermoelectric transducer apparatus.

Similarly, each of the heat-liberating-type plate electrodes 241, 242, ... comprises a pair of plates 271 and 272, their outwardly extended second plane areas 713 and 723 serving as so many heat-liberating-type heat exchange fins of a heat-liberating-type heat exchanger 31. Any of the paired outer surfaces of the second plane areas 713 and 723 which are in close contact with each other are bonded together by means of electrically insulating adhesive agent to establish an electrically insulated condition between them. Consequently layers of adhesive agent 321, 322, ... are formed. The first plane areas 712 and 722 of the plates 271, 272 of the plate electrodes 241, 242, ... are so arranged as to form a partition wall 33 that provides a flow path for the coolant fluid of the thermoelectric transducer apparatus.

A corrugated fin 34 is arranged within the space defined by the first plane areas 612, 622, the second plane areas 613, 614 and the anchor areas 614, 624 of each of the plate pairs 261-262, 263-264, ... of the heat-absorbing-type heat exchanger 28 and connected to the plate pair in a manner that ensures a good thermal conductivity between the fin and the plate pair. Likewise, a corrugated fin 34 is arranged within the space defined by the first plane areas 712, 722, the second plane areas 713, 723 and the anchor areas 714, 724 of each of the plate pairs 271-272, 273-274, ... of the heat-liberating-type heat exchanger 31. The corrugated fins 34 are typically made of a thermally conductive metal such as copper and provided with louvers to enhance their heat exchange capability.

With the arrangement of a thermoelectric transducer apparatus as described above, where N-type thermoelectric elements 211, 212, ... and P-type thermoelectric elements 221, 222, ... are alternately arranged in a single line and connected in series with one of heat-absorbing-type plate electrodes 231, 232, ... and heat-liberating-type plate electrodes 241, 242, ... interposed between any two adjacent elements, a low temperature condition that may appear in any of the heat-absorbing-type plate electrodes 231, 232, ... is directly conveyed to the plates 261 and 262 of the heat-absorbing type heat exchanger 28 for effective and efficient heat exchange without confronting any thermal barriers such as the insulator plates of a conventional thermoelectric transducer apparatus as shown in FIG. 18. Similarly, the heat-liberating-type heat exchanger 31 shows an excellent heat exchange performance as it is directly connected with the heat-liberating-type plate electrodes 241, 242, . . .

The heat-absorbing-type heat exchanger 28 is brought into direct contact with a flow of fluid to be cooled by the heat exchanger 28, whereas the heat-liberating-type heat exchanger 31 is brought into contact with a flow of coolant fluid that cools the heat exchanger 31. In order to promote the heat exchange operation at both of the heat exchangers, the flow path of the cooled fluid in the heat-absorbing-type heat exchanger 28 is completely separated from that of the coolant fluid in the heat-liberating-type heat exchanger 31 by the thermoelectric transducer unit 20.

While the separation of the two flows of fluid may be secured by the use of an appropriate sealing material, the partition wall 30 formed by the first plane areas 612, 622 of the plates 261, 262 of the heat-absorbing-type heat exchanger 29 serves as a wall that effectively enclose the cooled fluid. Similarly, the partition wall 33 formed by the first plane areas 712, 722 of the plates 271, 272 of the heat-liberating-type heat exchanger 31 is used to enclose the coolant fluid. Therefore, it may be seen that the cooled fluid and the coolant fluid are effectively separated from each other by a very simple structure.

As described above, the thermoelectric elements 211, 212, . . . , 221, 222, . . . of the thermoelectric transducer unit 20 are connected in series with one of the plate electrodes 231, 232, . . . , 241, 242, . . . interposed between any two adjacent thermoelectric elements and soldered together. Moreover, outer surfaces of each plate pair 261 and 262 of the heat-absorbing fins of the heat-absorbing-type heat exchanger 29 and those of each plate pairs 271 and 272 of the heat-liberating fins of the heat-liberating-type heat exchanger 31 are physically bonded together by an adhesive agent to form insulating layers of the adhesive agent 291, 292, . . . , 321, 322, . . . and consequently consolidate the heat-absorbing-type and heat-liberating-type heat exchangers 29, 31 and the thermoelectric transducer unit 20 of the thermoelectric transducer apparatus with sufficient mechanical strength.

If any of the plates 261, 262, 271, 272 and the corrugated fins 34 show dimensional deviations due to inaccurate molding and/or machining operations, such dimensional deviations may be absorbed by adjusting the thickness of related ones of the adhesive layers 291, 292, . . . , 321, 322, . . . so that the components of the thermoelectric transducer unit 20 may be prepared and assembled without rigorous dimensional accuracy.

While each of the plate electrodes are constituted by a pair of plates 261 and 262 or 271 and 272 in the above embodiment, a plate electrode for the purpose of the present invention may alternatively be formed by folding a single conductive plate as illustrated in FIG. 3A. Here, a one piece electrode section 41 is formed by simply folding a single plate and a pair of first plane areas 42, 43 are produced by bending the remote ends of the electrode section 41. Then, a pair of second plane areas 44, 45 are produced by bending the remote ends of the respective first plane areas 42, 43. Still alternatively, a plate electrode may be formed from a single conductive plate, which is bent rectangularly along a pair of parallel lines slightly off the middle to firstly produce a pair of second plane areas 44, 45 and bonded together at the extremities to produce an electrode section 41 as shown in FIG. 3B.

In the above embodiment, N-type thermoelectric elements 211, 212, . . . and P-type thermoelectric elements 221, 222, . . . are alternately arranged with a plate electrode interposed any two adjacent thermoelectric elements and soldered together. While such an arrangement has the advantages as described above, any of the thermoelectric elements can be displaced on the underlying solder if the solder is molten for some reason or other, ending up with some thermoelectric elements fallen or ejected out of the adjacent plate electrodes. The net result of such displacement will be an increase of the electric resistance and/or a reduced mechanical strength of the apparatus.

FIGS. 4A and 4B illustrate an alternative configuration of plate electrode designed to avoid such a problem. Here, either of the electrode sections 611 and 622 which are inserted between two thermoelectric elements, or the electrode section 611 in the illustration, of a pair of plates 261 and 262 is provided with an opening 51 for receiving one of the thermoelectric elements 211, 212, . . . , 221, 222, . . . , said opening 51 having dimensions slightly greater than the corresponding dimensions of the thermoelectric element which is put in the opening 51 and soldered to the electrode sections 611 and 622.

FIGS. 5A and 5B show still another alternative configuration of plate electrode, where either or both of paired electrode sections 611 and 622 are provided with a recess for receiving a thermoelectric element. Then, a pair of thermoelectric elements are soldered to the respective recesses 521, 522 which are formed by appropriate means such as a press machine.

With such an arrangement as described above referring to FIGS. 4A and 4B or FIGS. 5A and 5B, thermoelectric elements are securely held to their proper positions by the openings 511 or the recesses 521 and 522 of related electrode sections and would not be displaced or totally removed. Moreover, the solder used for bonding the thermoelectric elements to the related electrode sections would not flow out and be lost to reduce the mechanical strength and endanger the electrical insulation of the thermoelectric transducer apparatus if it is molten by heat. The arrangement of an opening or recesses may also be applied to plate electrodes as shown in FIGS. 3A and 3B.

Bolts and/or other mechanical means may alternatively or additionally be used to assemble the thermoelectric elements of a thermoelectric transducer apparatus according to the invention with an enhanced mechanical strength. The thermoelectric transducer apparatus may be mechanically further strengthened if insulated bolts are used to securely hold the heat-absorbing-type and heat-liberating-type heat exchangers in position.

FIG. 6 shows a second embodiment of the thermoelectric transducer apparatus of the invention. In FIG. 6, the plates of all plate pairs 261 and 262 of a heat-absorbing-type heat exchanger 28 are bent outwardly and obliquely at an end of the respective heat-absorbing-type plate electrodes 231, 232, . . . constituted by them to produce first plane areas 615, 625 extending upwardly and outwardly. The first plane areas 615, 625 of all the plate pairs of the heat-absorbing-type heat exchanger 28 are then serially connected in an end-to-end manner to form a partition wall 301. Similarly, the plates of all plate pairs 271 and 272 of a heat-liberating-type heat exchanger 31 are bent outwardly and obliquely at an end of the respective heat-liberating-type plate electrodes 241, 242, ... constituted by them to produce first plane areas 715, 725 extending downwardly and outwardly. The first plane areas 715, 725 of all the plate pairs of the heat-liberating-type heat exchanger 31 are then serially connected in an end-to-end manner to form a partition wall 331. All the remaining portions of this embodiment are similar to those of the first embodiment of FIG. 1 and therefore will not be described any further.

Figure 7:
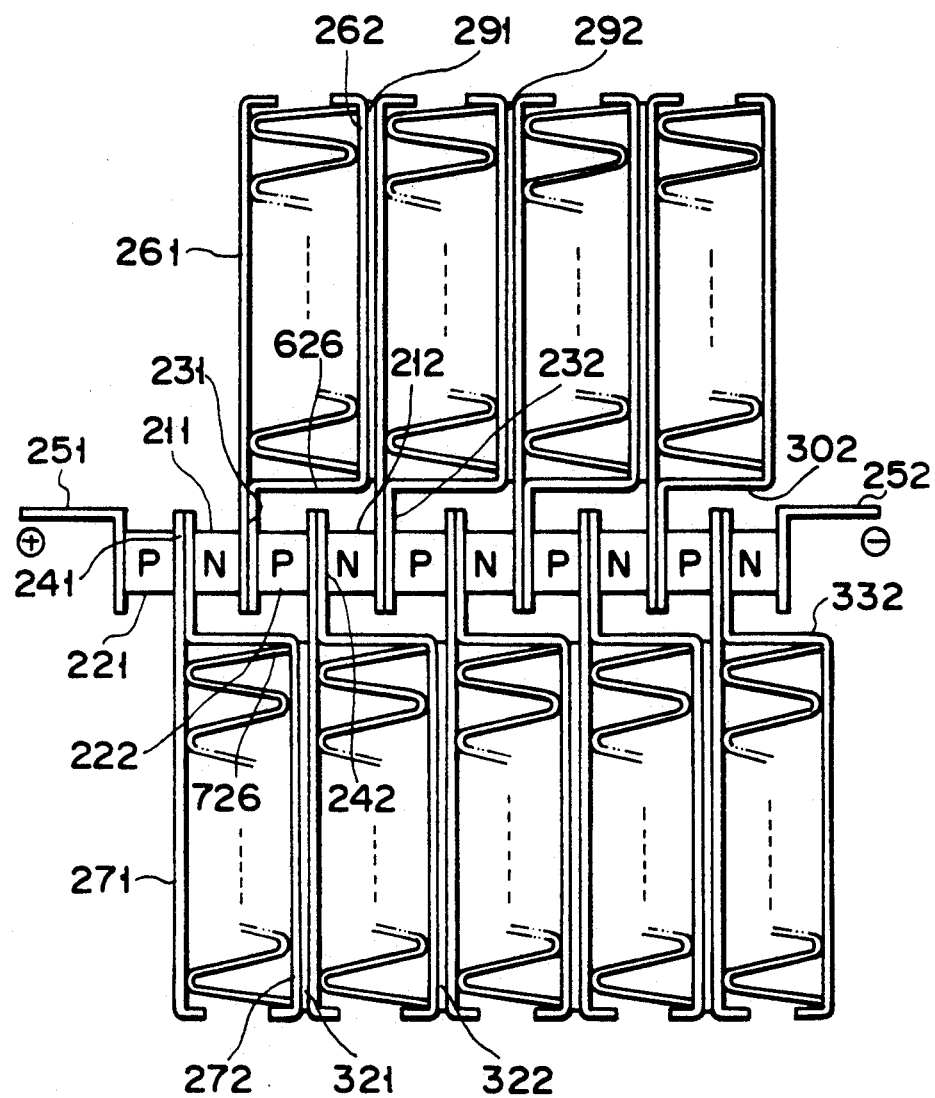
FIG. 7 is a front view of a third embodiment of the thermoelectric transducer apparatus of the invention, schematically illustrating its configuration.

In a third embodiment illustrated in FIG. 7, only one of the plates of each of the plate pairs 261 and 262 of a heat-absorbing-type heat exchanger 28, say plate 262, is bent to produce a first plane area 626 and similarly only one of the plates of each of the plate pairs 271 and 272 of a heat-liberating-type 31, say plate 272, is bent to produce a first plane area 726. The first plane area 626 obtained by bending the plate 262 at an end of the corresponding heat-absorbing-type plate electrode 231 extends to get in touch with the plate 261 of the adjacent heat-absorbing-type plate electrode 232, while the first plane area 726 obtained by bending the plate 272 at an end of the corresponding heat-absorbing-type plate electrode 241 extends to get in touch with the plate 271 of the adjacent heat-absorbing type plate electrode 242. Thus, a partition wall 302 is produced by serially arranging the first plane areas 626 of all the related plates of the heat-absorbing-type heat exchanger 28 while another partition wall 332 is formed by serially arranging the first plate area 726 of all the related plates of the heat-liberating-type heat exchanger 31.

While the outer surfaces of any two adjacent plates 261 and 262 are bonded together by means of electrically insulating adhesive agent to form layers of the adhesive agent 291, 292, ..., 321, 322, ... in this embodiment, the use of adhesive agent may be omitted if a heat-absorbing-type heat exchanger 28 heat-liberating-type heat exchanger 31 having a configuration as shown in FIG. 8A or 8B is used. (A heat-liberating-type heat exchanger 31 having a similar configuration will also be used.)

In FIG. 8A, while each of the plates 261 is a flat plate comprising an electrode section 611, each of the plates 262 is a bent plate comprising a first plane area 626 and a second plane area 623 and devoid of an electrode section. The plate 262 here is in fact a laminate of a pair of conductive metal layers 2621, 2622 and an insulating resin film 2623 which is sandwiched between the metal layers. It may be obvious that the outer surface of the plate 262 and that of the adjacent plate 261 are bonded together without losing electric conductivity at the interface. In this embodiment, a pair of thermoelectric elements are arranged on the opposite surfaces of the electrode section 611 of each plate 261.

FIG. 8B shows an alternative configuration of the heat-absorbing-type heat exchanger 28 of the embodiment of FIG. 7. Here, each of the plates 262 also comprises an electrode section 621 and bonded with the electrode section 611 of the plate 261. If a pair of thermoelectric elements are bonded to the two lateral sides of a plate electrode produced by bonding such electrode sections 611 and 621, the thermoelectric elements will be electrically insulated from each other. Therefore, an opening 522 for receiving a thermoelectric element is formed through the electrode section 621 of the plate 262 as in the case of FIG. 5A so that both of the thermoelectric elements are bonded to the electrode section 611, one of which being received in said opening 522.

FIG. 9 shows a still alternative configuration of the heat-absorbing-type heat exchanger 28 (which is also applicable to the heat-liberating-type heat exchanger 31). Here, the electrode sections 611 and 612 of each of the plate pairs 261 and 262 are cut off except the areas that come in direct contact respectively with the an N-type thermoelectric element 22 and a P-type thermoelectric element 21. This arrangement is designed to maximize the efficiency of transferring a cooled condition generated at the N-P junction, where the electrode sections 611 and 612 jointly play the role of a heat-absorbing-type plate electrode, to the heat exchanger 28.

Figure 10:
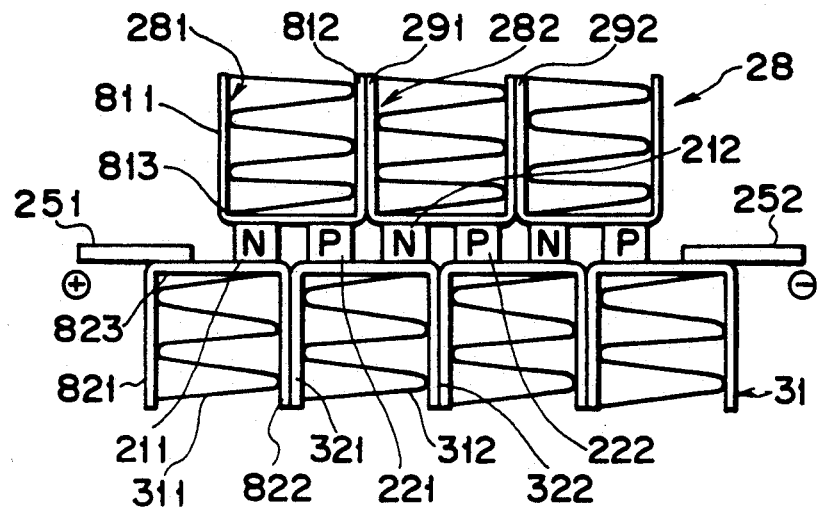
FIG. 10 is a front view of a fourth embodiment of the thermoelectric transducer apparatus of the invention, schematically illustrating its configuration.

As described above, N-type thermoelectric elements 211, 212, ... and P-type thermoelectric elements 221, 222, ... are alternatively arranged in a single straight line with a plate electrode interposed between any two adjacent thermoelectric elements in the preceding embodiments. On the contrary, in a fourth embodiment of the invention as shown in FIG. 10, a heat-absorbing-type heat exchanger 28 is constituted by a plurality of unit plates 281, 282, ..., each of which is formed by bending rectangularly a single flat plate along two parallel lines. Each of the unit plates 281, 282, ... therefore comprises a pair of parallel legs 811 and 812 and a central area 813 connecting the legs 811 and 812. Similarly, a heat-liberating-type heat exchanger 31 is constituted by a plurality of unit plates 311, 312, ..., each of which is formed by bending rectangularly a single flat plate along two parallel lines and comprises a pair of parallel legs 821 and 822 and a central area 823 connecting the legs 821 and 823. Any adjacent ones of the unit plates 281, 282, ... and those of the unit plates 311, 312, ... are bonded together by means of electrically insulating adhesive agent so that they are mutually electrically insulated.

The central areas 813 and 823 of the group of the unit plates 281, 282, ... and those of the group of the unit plates 311, 312, ... operate as so many plate electrodes and are arranged along the respective lateral sides of a straight line of N-type thermoelectric elements 211, 212, ... and P-type thermoelectric elements 221, 222, ... to hold the thermoelectric elements from both sides, each of the central areas 813 and 823 connecting one of the N-type thermoelectric elements 211, 212, ... and one of the P-type thermoelectric elements 221, 222, ... in such a manner that the thermoelectric elements of the two different types are alternately and serially connected.

With such an arrangement, both the heat-absorbing-type heat exchanger 28 and the heat-liberating-type heat exchanger 31 can be easily formed as a rigid structure to show an improved mechanical strength, the central areas 813 and 823 of the unit plates forming respective partition walls to securely separate the heat-absorbing side and the heat-liberating side of the apparatus.

Figure 11:
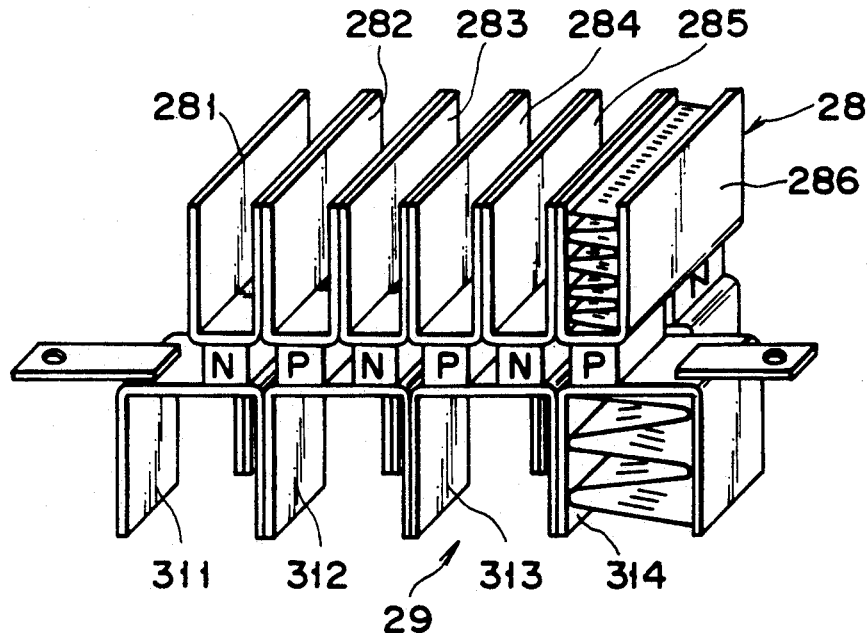
FIG. 11 is a front view of a fifth embodiment of the thermoelectric transducer apparatus of the invention, schematically illustrating its configuration.
Figure 12:
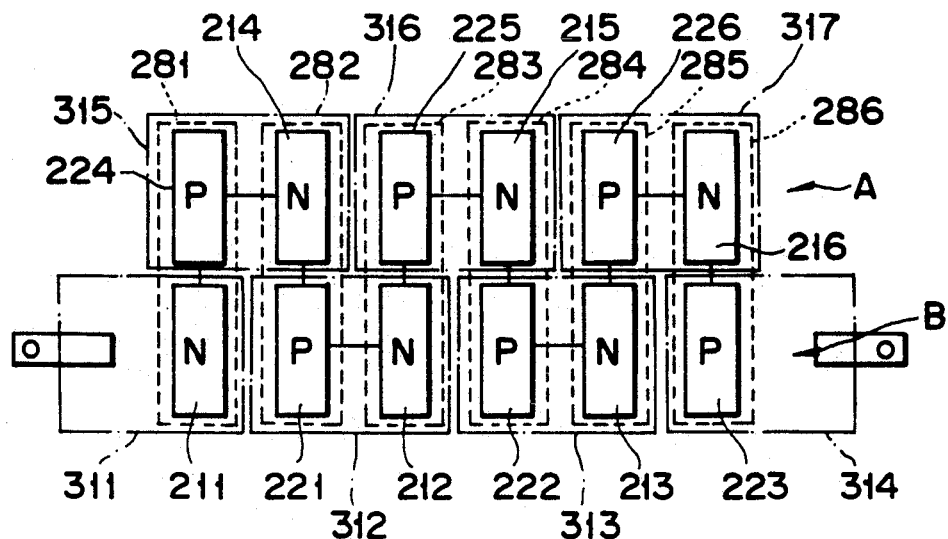
FIG. 12 is a plan view of the embodiment of FIG. 11.

FIG. 11 shows a fifth embodiment of the invention, comprising unit plates 281, 282, ... and 311, 312, ... as in the case of the embodiment of FIG. 10, although N-type thermoelectric elements 211, 212, ... and P-type thermoelectric elements, 221, 222, ... are arranged in two separate rows of thermoelectric elements, or element row A and element row B, as more clearly seen in FIG. 12. Then pairs of thermoelectric elements 211 and 224, 221 and 214, 212 and 225, 222 and 215, 213 and 226, 223 and 216 are connected respectively by the unit plates 281 to 286. The unit plate 311 is connected to the thermoelectric element 211 and the unit plates 312 and 313 respectively connect the thermoelectric elements 221 and 212 and 222 and 213, while the unit plate 314 is connected to the thermoelectric element 223. Besides, the unit plates 315 to 317 respectively connect the thermoelectric elements 224 and 214, 225 and 215 and 226 and 216, the N- and P-type thermoelectric elements are alternately arranged and serially connected.

Figure 13:
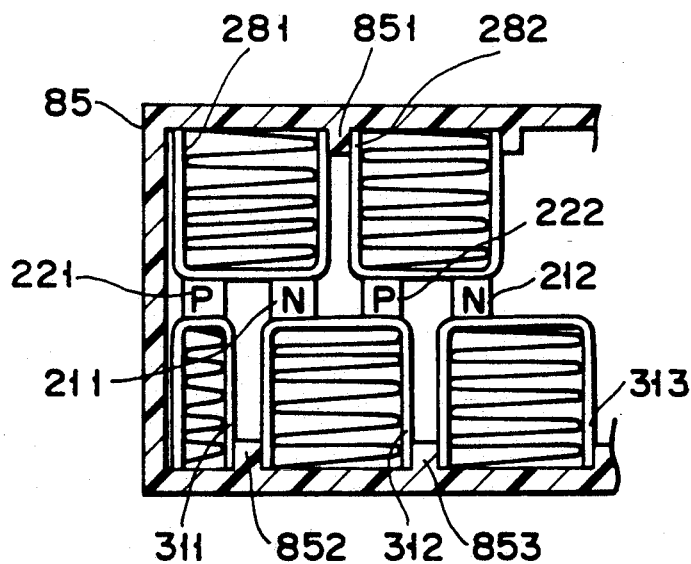
FIG. 13 is a front view of a sixth embodiment of the thermoelectric transducer apparatus of the invention, schematically illustrating its configuration.

FIG. 13 shows a sixth embodiment of the invention comprising a thermoelectric transducer unit which is similar to that of the embodiment of FIG. 10 but has a still higher mechanical strength as it is entirely housed in a case 85 made of a heat-resistive resin material. The inside of the case 85 is provided with ridges 851, 852, . . . for accurate alignment of the corresponding unit plates 281, 282, . . . and 311, 312, . . .

Figure 14:
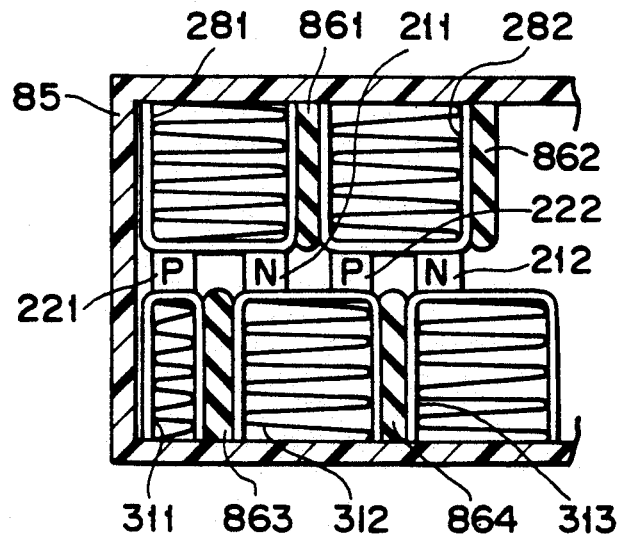
FIG. 14 is a front view of a seventh embodiment of the thermoelectric transducer apparatus of the invention, schematically illustrating its configuration.

In a seventh embodiment as illustrated in FIG. 14, a unit comprising N-type thermoelectric elements 211, 212, . . . , P-type thermoelectric elements 221, 222, . . . and unit plates 281, 282, . . . , 211, 312, . . . is entirely housed in a resin case 85 like that of the embodiment of FIG. 13. Here, however, neighboring unit plates are completely separated form each other by spacers 861, 862, . . . also made of an insulating material.

Figure 15A:
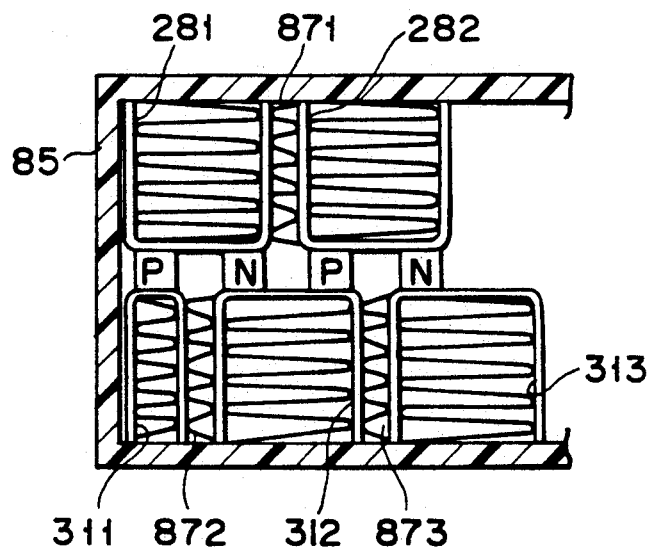
FIG. 15A is a front view of an eighth embodiment of the thermoelectric transducer apparatus of the invention, schematically illustrating its configuration.
Figure 15B:
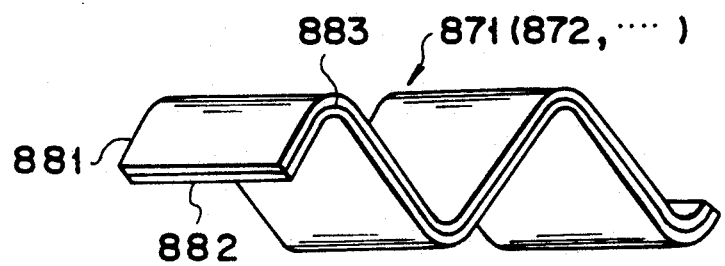
FIG. 15B is a perspective view of a fin to be used for the embodiment of FIG. 15A.

FIG. 15A shows an eighth embodiment of the invention. Here, the spacers 861, 862, . . . of the seventh embodiment as described above are replaced by fin members 871, 872, . . . Since any adjacent unit plates 281, 282, . . . and 311, 312, . . . need to be electrically insulated from each other, each of the fin members 871, 872, . . . is made of a corrugated laminate comprising a pair of aluminum layers 881 and 882 and a resin layer 883 sandwiched by the aluminum layers as illustrated in FIG. 15B.

The case of a heat-resistive resin material 85 may be omitted from this embodiment when each of the fin members 871, 872, . . . and the neighboring unit plates are firmly soldered.

It should be noted that an array of N-type thermoelectric elements 211, 212, . . . and P-type thermoelectric elements 221, 222, . . . is held between a group of unit plates 281, 282, . . . and another group of unit plates 311, 312, . . . in any of the fourth through eighth embodiments as described above.

Figure 16A:
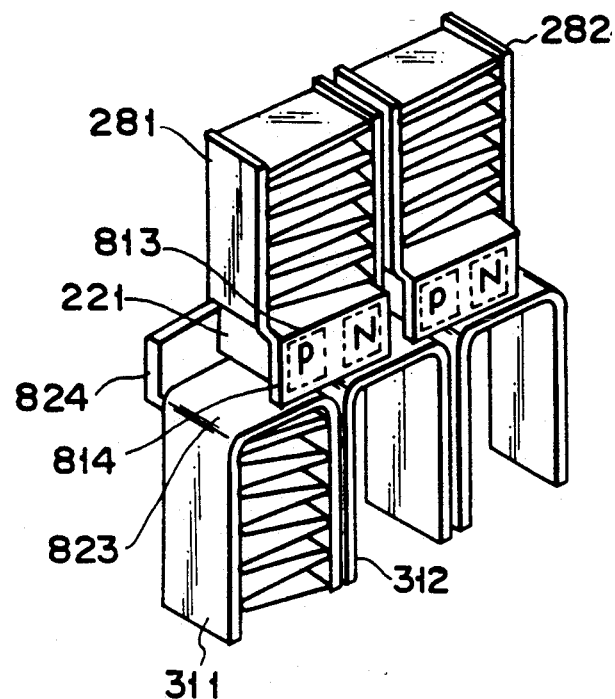
FIG. 16A is a perspective view of a ninth embodiment of the thermoelectric transducer apparatus of the invention, schematically illustrating its configuration.
Figure 16B:
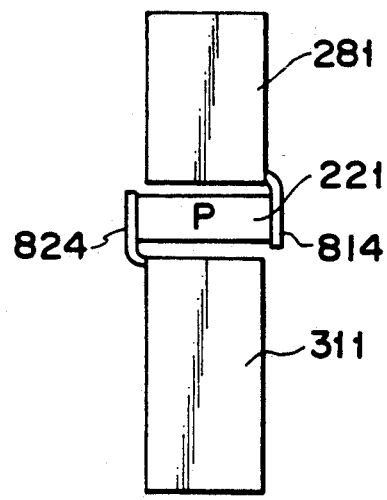
FIG. 16B is a side view of the embodiment of FIG. 16A.

FIGS. 16A and 16B show a ninth embodiment of the invention where an array of thermoelectric elements 211, 212, . . . , 221, 222, . . . is held in a different manner. Here, the central area 813 of each of a group of unit plates 281, 282, . . . is extended forward to form a holder area 814 and the central area 824 of each of another group of unit plates 311, 312, . . . is extended rearward to form a similar holder area 824, said holder areas 814 and 824 defining the horizontal length of the unit plates and holding a P-type thermoelectric element 221 (or N-type thermoelectric element 211) between them, said element and said holder areas being soldered to form a rigid structure.

While a gap is formed between any two adjacent unit plates of the group of unit plates 281, 282, . . . as well as between any two adjacent unit plates of the other group of unit plates 311, 312, . . . as shown in FIG. 16A, the mechanical strength of the embodiment will be significantly enhanced if the neighboring unit plates are bonded together by means of electrically insulating adhesive agent.

FIGS. 17A and 17B show a tenth embodiment of the invention which is similar to the ninth embodiment as described above but in which ceramic insulator plates 891, 892 are arranged respectively between an array of thermoelectric elements and the central areas 813 of a group of unit plates 281, 282, . . . and between the array of thermoelectric elements and the central areas 823 of another group of unit plates 311, 312. . . . Here, the insulator plates 891, 892 are used to firmly hold the array of thermoelectric elements between them and then by turn held from outside by the respective central areas 813 and 823 of the two groups of unit plates so that the mechanical strength of the embodiment is further enhanced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is

1. A thermoelectric transducer apparatus primarily constituted by N-type semiconductors and P-type semiconductors and having electronic control capabilities comprising:

a group of pairs of thermoelectric elements linearly arranged, each pair being constituted by an N-type thermoelectric element and a P-type thermoelectric element arranged in this order;

heat-absorbing-type plate electrodes and heat-liberating-type plate electrodes arranged alternately, each plate electrode connecting two adjacent thermoelectric elements to electrically and serially connect said N- and P-type thermoelectric elements;

a DC power source connected to the both ends of said line of thermoelectric elements electrically and serially connected by arranging each of said heat-absorbing-type and heat-liberating-type plate electrodes between two adjacent thermoelectric elements to supply each of said heat-absorbing-type plate electrodes with an electric current running from the N-type thermoelectric element to the P-type thermoelectric element connected thereto and each of said heat-liberating-type plate electrodes with an electric current running from the P-type thermoelectric element to the N-type thermoelectric element;

pairs of heat-absorbing heat exchanger plates, each of said pairs being formed by extending one of said heat-absorbing type plate electrodes to a side of said line of N- and P-type thermoelectric elements to form a pair of heat-absorbing fins integral with said heat-absorbing-type plate electrode;

pairs of heat-liberating heat exchanger plates, each of said pairs being formed by extending one of said heat-liberating-type plate electrodes to a side of said line of N- and P-type thermoelectric elements opposite to that of said pairs of heat-absorbing fins to form a pair of heat-liberating fins integral with said heat-liberating-type plate electrode;

means for physically binding and electrically insulating adjacent heat-absorbing heat exchanger plates extending from related neighboring heat-absorbing-type plate electrodes and adjacent heat-liberating-type heat exchanger plates extending from related neighboring heat-liberating-type plate electrodes;

partition wall formed by part of said heat-absorbing-type or heat-liberating type plate electrodes or said heat-absorbing or heat-liberating heat exchanger plates integral with said respective electrodes to provide a partition for separating flow paths of cooled and coolant fluids.

2. An apparatus according to claim 1, wherein said partition walls comprise a first partition wall and a second partition wall, said first partition wall for a flow path of cooled fluid being formed by successively arranging segments of said heat-absorbing-type plate electrodes or said heat-absorbing-type heat exchanger plates integral with said respective plate electrodes along said N- and P-type thermoelectric elements, each of said segments of said first partition wall being a part of a heat-absorbing-type plate electrode or a heat-absorbing-type heat exchanger plate, said second partition wall for a flow path of coolant fluid being formed by arranging segments of said heat-liberating-type plate electrodes or said heat-liberating-type heat exchanger plates integral with said respective plate electrodes along said line of N- and P-type thermoelectric elements, each of said segments of said second partition wall being a part of a heat-liberating-type plate electrode or a heat-liberating-type heat exchanger plate.

3. An apparatus according to claim 1, wherein each of said heat-absorbing-type and heat-liberating-type plate electrodes is interposed between one of said N-type thermoelectric elements and one of said P-type thermoelectric elements arranged side by side to electrically and serially connect said alternately arranged N- and P-type thermoelectric elements.

4. An apparatus according to claim 2, wherein each of said heat-absorbing-type and heat-liberating-type plate electrodes is interposed between one of said N-type thermoelectric elements and one of said P-type thermoelectric elements arranged side by side to electrically and serially connect said alternately arranged N- and P-type thermoelectric elements and said first partition wall is constituted by first plane areas of the heat-absorbing heat exchanger plates formed by laterally bending each pair of said heat-absorbing heat exchanger plates extending from a heat-absorbing-type plate electrode while said second partition wall is constituted by first plane areas of the heat-liberating heat exchanger plates formed by laterally bending each pair of said heat liberating heat exchanger plates extending from a heat-liberating-type plate electrode.

5. An apparatus according to claim 4, wherein said first plane areas are formed by bending rectangularly each of said heat-absorbing and heat-liberating heat exchanger plates to a direction parallel to that of said line of thermoelectric elements.

6. An apparatus according to claim 4, wherein said first plane areas are formed by bending obliquely each of said heat-absorbing and heat-liberating heat exchanger plates to a direction leaving said line of thermoelectric elements.

7. An apparatus according to claim 2, wherein each of said heat-absorbing-type and heat-liberating-type plate electrodes is interposed between one of said N-type thermoelectric elements and on of said P-type thermoelectric elements arranged side by side to electrically and serially connect said alternately arranged N- and P-type thermoelectric elements and said first partition wall is constituted by first plane areas of the heat-absorbing heat exchanger plates formed by laterally bending one of each pair of said heat-absorbing heat exchanger plates extending from a heat-absorbing-type plate electrode and holding it out until it reaches an adjacent heat-absorbing heat exchanger plate while said second partition wall is constituted by first plane areas of the heat-liberating heat exchanger plates formed by laterally bending one of each pair of said heat-liberating heat exchanger plates extending from a heat-liberating-type plate electrode and holding it out until it reaches an adjacent heat-liberating heat exchanger plate.

8. An apparatus according to claim 1, further comprising corrugated fins, each being arranged between the heat-absorbing or heat-liberating fins of each pair.

9. An apparatus according to claim 1, wherein each of said heat-absorbing-type and heat-liberating-type plate electrodes is formed by laminating a pair of metal plates and each pair of said heat-absorbing or heat-liberating heat exchanger plates are formed by outwardly extending said pair of metal plates.

10. An apparatus according to claim 1, wherein each pair of said heat-absorbing or heat-liberating heat exchanger plates are formed by folding a single metal plate, a corresponding heat-absorbing type or heat-liberating-type plate electrode being formed by a portion of said metal plate close to the folding line.

11. An apparatus according to claim 1, wherein each of said heat-absorbing-type or heat-liberating-type electrodes is formed by partly laminating a pair of said metal plates to be used for a pair of heat-absorbing or heat-liberating heat exchanger plates, an opening being formed through one of said metal plates in the laminated area for receiving an N- or P-type thermoelectric element so that said thermoelectric element is placed in said opening in contact with the other metal plate.

12. An apparatus according to claim 1, wherein each of said heat-absorbing-type or heat-liberating-type electrodes is formed by partly laminating a pair of said metal plates to be used for a pair of heat-absorbing or heat-liberating heat exchanger plates, a recess being formed on at least one of said metal plates in the laminated area for receiving an N- or P-type thermoelectric element so that said thermoelectric element is placed said recess in contact with the metal plate having said recess.

13. An apparatus according to claim 1, wherein one of each pair of said heat-absorbing or heat-liberating heat exchanger plates is a laminate comprising a pair of metal layers and an insulation layer sandwiched by said metal layers and soldered to adjacent one of a pair of heat-absorbing or heat-liberating heat exchanger plates, whichever appropriate, the solder used for soldering said plates constituting a bonding means.

14. An apparatus according to claim 1, wherein said heat-absorbing-type plate electrodes and said heat-liberating-type plate electrodes are arranged along respective lateral sides of the line of alternately arranged N- and P-type thermoelectric elements, each of said plate electrodes electrically connecting two adjacent thermoelectric elements so that said alternately arranged N- and P-type thermoelectric elements are electrically and serially connected.

15. An apparatus according to claim 14, wherein a pair of heat-absorbing or heat-liberating heat exchanger plates are formed by extending and rectangularly bending a pair of opposite ends of a heat-absorbing-type or heat-liberating-type plate electrode, whichever appropriate, in a direction leaving said line of N- and P-type thermoelectric elements.

16. An apparatus according to claim 1, wherein said heat-absorbing-type plate electrodes and said heat-liberating-type plate electrodes are arranged along respective lateral sides of the line of alternately arranged N- and P-type thermoelectric elements, each of said plate electrodes electrically connecting two adjacent thermoelectric elements so that said alternately arranged N- and P-type thermoelectric elements are electrically and serially connected, while a pair of heat-absorbing or heat-liberating heat exchanger plates are formed by extending and rectangularly bending a pair of opposite ends of a heat-absorbing-type or heat-liberating-type plate electrode, whichever appropriate, in a direction leaving said line of N- and P-type thermoelectric elements, pairs of heat exchanger plates thus formed constituting a thermoelectric transducer unit, said thermoelectric transducer unit being housed in a case of an insulating material.

17. An apparatus according to claim 16, wherein ridges are integrally formed within said case of an insulating material, each of said ridges being arranged between two adjacent pairs of heat-absorbing or heat-liberating heat exchanger plates to securely hold the related heat-absorbing or heat-liberating heat exchanger plates, whichever appropriate.

18. An apparatus according to claim 16, wherein spacers of an insulating material are integrally formed within said case of an insulating material, each of said spacers being arranged between two adjacent pairs of heat-absorbing or heat-liberating heat exchanger plates to securely hold the related heat-absorbing or heat-liberating heat exchanger plates, whichever appropriate.

19. An apparatus according to claim 16, wherein a corrugated fin is arranged between two adjacent pairs of heat-absorbing or heat-liberating heat exchanger plates, said corrugated fin being made of a laminate comprising a pair of metal layers and an insulating layer sandwiched between said metal layers.

20. An apparatus according to claim 1, wherein said group of pairs of thermoelectric elements are arranged in two rows, a first row of thermoelectric elements comprising alternately arranged N- and P-type thermoelectric elements and a second row of alternately arranged P- and N-type thermoelectric elements, and each of said heat-absorbing-type and heat-liberating-type plate electrodes is arranged to bridge said first and second rows of thermoelectric elements and connect a pair of N- and P-type thermoelectric elements in such a manner that the P- and N-type thermoelectric elements of said first and second rows of thermoelectric elements are electrically and serially connected, each of said heat-absorbing-type and heat-liberating-type plate electrodes being extended and rectangularly bent to leave the rows of thermoelectric elements at a pair of opposite edges located on said first and second rows of thermoelectric elements and form a pair of heat-absorbing or heat-liberating heat exchanger plates, whichever appropriate.

21. An apparatus according to claim 1, wherein said heat-absorbing-type and heat-liberating-type plate electrodes are respectively arranged on a pair of opposite sides of said group of thermoelectric elements to electrically and serially connect said group of thermoelectric elements comprising alternately arranged N- and P-type thermoelectric elements, each of said plate electrode being extended and rectangularly bent to form a central area arranged in parallel with and spaced apart from said group of thermoelectric elements, said central area being further extended along and rectangularly bent to leave said group of thermoelectric elements to form a pair of heat-absorbing or heat-liberating heat exchanger plates, whichever appropriate, said central area being used to form said partition wall, whichever appropriate.

22. An apparatus according to claim 21, wherein a pair of insulator plates are arranged between a pair of opposite sides of said group of thermoelectric elements and the central areas formed by extending said plate electrodes and arranged to face said pair of opposite sides with and spaced apart from them.

* * * * *